US006885133B2

(12) United States Patent
Wong

(10) Patent No.: US 6,885,133 B2
(45) Date of Patent: Apr. 26, 2005

(54) HIGH FREQUENCY BENDING-MODE LATCHING RELAY

(75) Inventor: Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 172 days.

(21) Appl. No.: 10/412,912

(22) Filed: Apr. 14, 2003

(65) Prior Publication Data

US 2004/0201311 A1 Oct. 14, 2004

(51) Int. Cl.[7] ........................ H01L 41/08; H01H 29/00; H01H 57/00

(52) U.S. Cl. ....................... 310/328; 200/182; 200/214; 200/215; 335/47; 335/49; 335/58

(58) Field of Search ................................ 310/328, 348, 310/353; 200/182, 214, 215; 335/47, 49, 58

(56) References Cited

U.S. PATENT DOCUMENTS

| | | | | |
|---|---|---|---|---|
| 2,312,672 A | | 3/1943 | Pollard, Jr. | 335/58 |
| 2,564,081 A | | 8/1951 | Schilling | 335/56 |
| 3,423,704 A | * | 1/1969 | Brander | 335/47 |

(Continued)

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |
| FR | 2667396 | 9/1990 |
| GB | 2052871 A | 5/1980 |
| GB | 2381595 A | 10/2002 |

(Continued)

OTHER PUBLICATIONS

Bhedwar, Homi C. Et Al. "Ceramic Multilayer Package Fabrication."0 Electronic Materials Handbook, Nov. 1989, pp. 460–469, vol. 1 Packaging, Section 4: Packages.
"Integral Power Resistors for Aluminum Substrate." IBM Technical Disclosure Bulletin, Jun. 1984, US, Jun. 1, 1984, p. 827, vol. 27, No. 1B, TDB–ACC–No.: NB8406827, Cross Reference: 0018–8689–27–1B–827.
Kim, Joonwon Et Al. "A Micromechanical Switch with Electrostatically Driven Liquid–Metal Droplet." Sensors and Actuators, A: Physical. v 9798, Apr. 1, 2002, 4 pages.
Jonathan Simon, "A Liquid–Filled Microrelay With A Moving Mercury Microdrop" (Sep. 1997), Journal of Microelectromechinical Systems, vol. 6, No. 3, pp 208–216.
Marvin Glenn Wong, "A Piezoelectrically Actuated Liquid Metal Switch", May 2, 2002, patent application (pending, 12 pages of specification, 5 pages of claims, 1 page of abstract, and 10 sheets of drawings (Figs. 1–10).

*Primary Examiner*—Thomas M. Dougherty

(57) ABSTRACT

An electrical relay that uses a conducting liquid in the switching mechanism. In the relay, a pair of moveable switching contacts is attached to the free end of a piezoelectric actuator and positioned between a pair of fixed electrical contact pads. The electrical connections to the switching contacts and the fixed electrical contact pads are ground shielded. A surface of each contact supports a droplet of a conducting liquid, such as a liquid metal. The piezoelectric actuator is energized to deform in a bending mode and move the pair of switching contacts, closing the gap between one of the fixed contact pads and one of the switching contacts, thereby causing conducting liquid droplets to coalesce and form an electrical circuit. At the same time, the gap between the other fixed contact pad and the other switching contact is increased, causing conducting liquid droplets to separate and break an electrical circuit. The piezoelectric actuator is then de-energized and the switching contacts return to their starting positions. The volume of liquid metal is chosen so that liquid metal droplets remain coalesced or separated because of surface tension in the liquid. The relay is amenable to manufacture by micromachining techniques.

13 Claims, 2 Drawing Sheets

U.S. PATENT DOCUMENTS

| | | | | | |
|---|---|---|---|---|---|
| 3,430,020 | A | | 2/1969 | Von Tomkewitsch et al. | 200/181 |
| 3,529,268 | A | | 9/1970 | Rauterberg | 335/56 |
| 3,600,537 | A | | 8/1971 | Twyford | 200/407 |
| 3,639,165 | A | | 2/1972 | Rairden, III | 428/433 |
| 3,657,647 | A | | 4/1972 | Beusman et al. | 324/94 |
| 4,103,135 | A | | 7/1978 | Gomez et al. | 200/185 |
| 4,200,779 | A | | 4/1980 | Zakurdaev et al. | 200/187 |
| 4,238,748 | A | | 12/1980 | Goullin et al. | 335/56 |
| 4,245,886 | A | | 1/1981 | Kolodzey et al. | 385/19 |
| 4,336,570 | A | | 6/1982 | Brower | 362/4 |
| 4,419,650 | A | | 12/1983 | John | 337/119 |
| 4,434,337 | A | | 2/1984 | Becker | 200/220 |
| 4,475,033 | A | | 10/1984 | Willemsen et al. | 250/201.1 |
| 4,505,539 | A | | 3/1985 | Auracher et al. | 385/19 |
| 4,582,391 | A | | 4/1986 | Legrand | 385/17 |
| 4,628,161 | A | | 12/1986 | Thackrey | 200/61.47 |
| 4,652,710 | A | | 3/1987 | Karnowsky et al. | 200/235 |
| 4,657,339 | A | | 4/1987 | Fick | 385/22 |
| 4,689,517 | A | * | 8/1987 | Harnden et al. | 310/332 |
| 4,742,263 | A | | 5/1988 | Harnden, Jr. et al. | 310/331 |
| 4,755,706 | A | * | 7/1988 | Harnden et al. | 310/332 |
| 4,786,130 | A | | 11/1988 | Georgiou et al. | 385/48 |
| 4,797,519 | A | | 1/1989 | Elenbaas | 200/226 |
| 4,804,932 | A | | 2/1989 | Akanuma et al. | 335/38 |
| 4,988,157 | A | | 1/1991 | Jackel et al. | 385/17 |
| 5,278,012 | A | | 1/1994 | Yamanaka et al. | 430/30 |
| 5,356,679 | A | | 10/1994 | Houis et al. | 385/18 |
| 5,415,026 | A | | 5/1995 | Ford | 73/651 |
| 5,502,781 | A | | 3/1996 | Li et al. | 385/4 |
| 5,644,676 | A | | 7/1997 | Blomberg et al. | 370/416 |
| 5,675,310 | A | | 10/1997 | Wojnarowski et al. | 338/309 |
| 5,677,823 | A | | 10/1997 | Smith | 361/234 |
| 5,751,074 | A | | 5/1998 | Prior et al. | 307/118 |
| 5,751,552 | A | | 5/1998 | Scanlan et al. | 361/707 |
| 5,828,799 | A | | 10/1998 | Donald | 385/16 |
| 5,841,686 | A | | 11/1998 | Chu et al. | 365/51 |
| 5,849,623 | A | | 12/1998 | Wojnarowski et al. | 438/382 |
| 5,874,770 | A | | 2/1999 | Saia et al. | 257/536 |
| 5,875,531 | A | | 3/1999 | Nellissen et al. | 29/25.35 |
| 5,886,407 | A | | 3/1999 | Polese et al. | 257/706 |
| 5,889,325 | A | | 3/1999 | Uchida et al. | 257/724 |
| 5,912,606 | A | | 6/1999 | Nathanson et al. | 335/47 |
| 5,915,050 | A | | 6/1999 | Russell et al. | 385/7 |
| 5,972,737 | A | | 10/1999 | Polese et al. | 438/122 |
| 5,994,750 | A | | 11/1999 | Yagi | 257/415 |
| 6,021,048 | A | | 2/2000 | Smith | 361/736 |
| 6,180,873 | B1 | | 1/2001 | Bitko | 174/9 E |
| 6,201,682 | B1 | | 3/2001 | Mooij et al. | 361/306.1 |
| 6,207,234 | B1 | | 3/2001 | Jiang | 427/333 |
| 6,212,308 | B1 | | 4/2001 | Donald | 385/16 |
| 6,225,133 | B1 | | 5/2001 | Yamamichi et al. | 438/3 |
| 6,278,541 | B1 | | 8/2001 | Baker | 359/291 |
| 6,304,450 | B1 | | 10/2001 | Dibene, II et al. | 361/704 |
| 6,320,994 | B1 | | 11/2001 | Donald et al. | 385/16 |
| 6,323,447 | B1 | | 11/2001 | Kondoh et al. | |
| 6,351,579 | B1 | | 2/2002 | Early et al. | 385/18 |
| 6,356,679 | B1 | | 3/2002 | Kapany | 385/18 |
| 6,373,356 | B1 | | 4/2002 | Gutierrez et al. | |
| 6,396,012 | B1 | | 5/2002 | Bloomfield | 200/233 |
| 6,396,371 | B2 | | 5/2002 | Streeter et al. | 335/78 |
| 6,408,112 | B1 | | 6/2002 | Bartels | 385/16 |
| 6,446,317 | B1 | | 9/2002 | Figueroa et al. | 29/25.42 |
| 6,453,086 | B1 | | 9/2002 | Tarazona | 385/20 |
| 6,470,106 | B2 | | 10/2002 | McClelland et al. | 385/16 |
| 6,487,333 | B2 | | 11/2002 | Fouquet | 385/18 |
| 6,501,354 | B1 | | 12/2002 | Gutierrez et al. | 335/47 |
| 6,504,118 | B2 | * | 1/2003 | Hyman et al. | 200/181 |
| 6,512,322 | B1 | | 1/2003 | Fong et al. | |
| 6,515,404 | B1 | | 2/2003 | Wong | |
| 6,516,504 | B2 | | 2/2003 | Schaper | 29/25.42 |
| 6,559,420 | B1 | | 5/2003 | Zarev | 219/209 |
| 6,633,213 | B1 | | 10/2003 | Dove | 335/78 |
| 6,756,551 | B2 | * | 6/2004 | Wong | 200/214 |
| 2002/0037128 | A1 | | 3/2002 | Burger et al. | 385/16 |
| 2002/0146197 | A1 | | 10/2002 | Yong | 385/17 |
| 2002/0150323 | A1 | | 10/2002 | Nishida et al. | 385/16 |
| 2002/0168133 | A1 | | 11/2002 | Saito | 385/16 |
| 2003/0035611 | A1 | | 2/2003 | Shi | 385/16 |
| 2004/0200702 | A1 | * | 10/2004 | Wong | 300/328 |
| 2004/0201318 | A1 | * | 10/2004 | Wong | 310/328 |
| 2004/0201319 | A1 | * | 10/2004 | Wong | 310/328 |
| 2004/0201321 | A1 | * | 10/2004 | Wong | 310/328 |

FOREIGN PATENT DOCUMENTS

| | | | |
|---|---|---|---|
| GB | 2381663 | A | 10/2002 |
| GB | 2388471 | A | 3/2003 |
| JP | SHO 36-18575 | | 10/1961 |
| JP | SHO 42-21645 | | 10/1972 |
| JP | 63-276838 | | 5/1987 |
| JP | 01-294317 | | 5/1988 |
| JP | 08-125487 | A | 5/1996 |
| JP | 9161640 | | 6/1997 |
| WO | WO 99/46624 | A1 | 9/1999 |

* cited by examiner

HIGH FREQUENCY BENDING-MODE LATCHING RELAY

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020540-1, "Method and Structure for a Solid Slug Caterpillar Piezoelectric Relay", and having the same filing date as the present application;

Application 10020541-1, titled "Method and Structure for a Solid Slug Caterpillar Piezoelectric Optical Relay", and having the same filing date as the present application;

Application 10030438-1, "Inserting-finger Liquid Metal Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

FIELD OF THE INVENTION

The invention relates to the field of micro-electromechanical systems (MEMS) for electrical switching, and in particular to a piezoelectrically actuated latching relay with liquid metal contacts.

BACKGROUND OF THE INVENTION

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Conventional piezoelectric relays either do not latch or use residual charges in the piezoelectric material to latch or else activate a switch that contacts a latching mechanism.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY

An electrical relay is disclosed that uses a conducting liquid in the switching mechanism. In the relay, a pair of moveable switching contacts is attached to the free end of a piezoelectric actuator and positioned between a pair of fixed contact pads. Each contact supports a droplet of conducting liquid, such as a liquid metal. The actuator is energized to deform in a bending-mode and move the pair of switching contacts, closing the gap between one of the fixed contact pads and one of the switching contacts, thereby causing conducting liquid droplets to coalesce and form an electrical circuit. At the same time, the gap between the other fixed contact pad and the other switching contact is increased, causing conducting liquid droplets to separate and break an electrical circuit.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
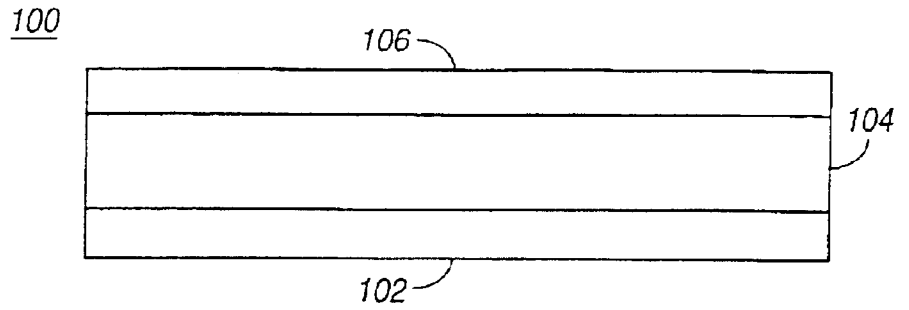
FIG. 1 is a side view of a latching relay of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The electrical relay of the present invention uses a conducting liquid, such as liquid metal, to bridge the gap between two electrical contacts and thereby complete an electrical circuit between the contacts. Two moveable electrical contacts, which will be referred to as switching contacts, are attached to the free end of a piezoelectric actuator and positioned between a pair of fixed contact pads. Magnetorestrictive actuators, such as Terenol-D, that deform in the presence of a magnetic field may be used as an alternative to piezoelectric actuators. In the sequel, piezoelectric actuators and magnetorestrictive actuators will be collectively referred to as "piezoelectric actuators". A surface of each contact supports a droplet of a conducting liquid. In the preferred embodiment, the conducting liquid is a liquid metal, such as mercury, with high conductivity, low volatility and high surface tension. When energized, the piezoelectric actuator deforms in a bending mode and moves the switching contacts so that a first switching contact moves towards a first fixed contact pad, causing the conducting liquid droplets on the contacts to coalesce and complete an electrical circuit between the first switching contact and the first fixed contact pad. Since the switching contacts are placed between the fixed contact pads, as the first switching contact moves towards the first fixed contact pad, the second switching contact moves away from the second fixed contact pad. After the switch-state has changed, the piezoelectric actuator is de-energized and the switching contacts return to their starting positions. The conducting liquid droplets remain coalesced in a single volume because the volume of conducting liquid is chosen so that surface tension holds the droplets together. The electrical circuit is broken again by energizing the piezoelectric actuator to move the first switching contact away from the first fixed contact pad to break the surface tension bond between the conducting liquid droplets. The droplets remain separated when the piezoelectric actuator is de-energized, provided there is insufficient liquid to bridge the gap between the contacts. The relay is amenable to manufacture by micro-machining techniques.

FIG. 1 is a side view of an embodiment of a latching relay of the present invention. Referring to FIG. 1, the relay 100 comprises three layers: a circuit substrate 102, a switching layer 104 and a cap layer 106. These three layers form a relay housing. The circuit substrate 102 supports electrical connections to the elements in the switching layer and provides a lower cap to the switching layer. The circuit substrate 102 may be made of a ceramic or silicon, for example, and is amenable to manufacture by micro-machining techniques, such as those used in the manufacture of micro-electronic devices. The switching layer 104 may be made of ceramic or glass, for example, or may be made of metal coated with an insulating layer (such as a ceramic). The cap layer 106 covers the top of the switching layer 104, and seals the switching cavity 108. The cap layer 106 may be made of ceramic, glass, metal or polymer, for example, or combinations of these materials. Glass, ceramic or metal is used in the preferred embodiment to provide a hermetic seal.

Figure 2:
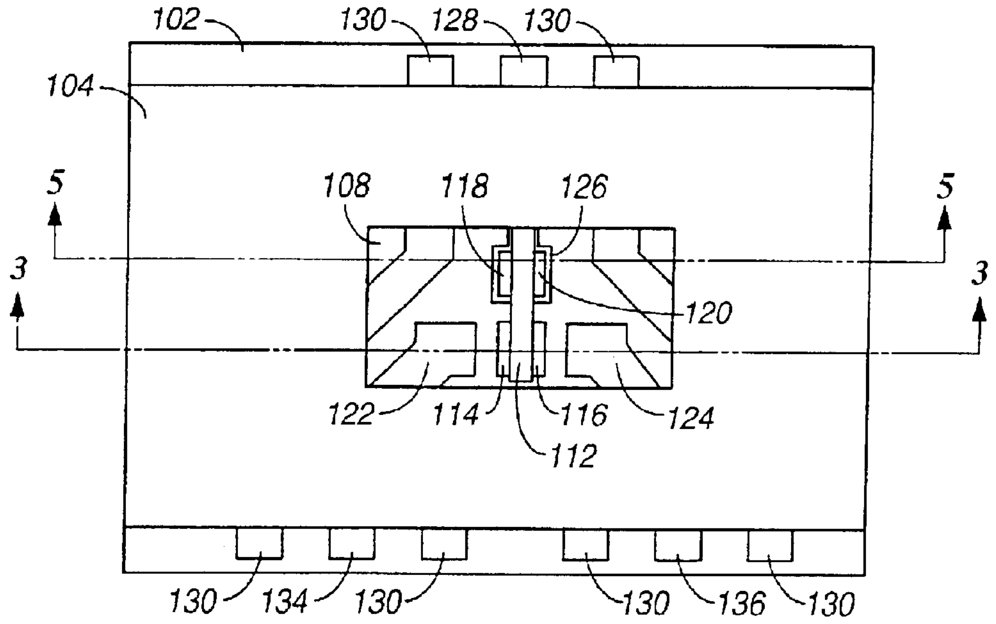
FIG. 2 is a top view of a latching relay of the present invention with the cap layer removed.

FIG. 2 is a top view of the relay with the cap layer and the conducting liquid removed. Referring to FIG. 2, the switching layer 104 incorporates a switching cavity 108. The switching cavity 108 is sealed below by the circuit substrate 102 and sealed above by the cap layer 106. The cavity may be filled with an inert gas. A piezoelectric actuator 112 is attached to the switching layer. The actuator is deformable in a bending mode so that the free end of the actuator moves laterally between the fixed contact pads 122 and 124. The actuator may comprise a stack of piezoelectric elements. In the preferred embodiment, an electrical signal is routed to the switching contacts through additional moveable contacts 118 and 120 on the actuator that are electrically coupled to the switching contacts 114 and 116. The additional moveable contacts are coupled to an electrical pad 126 on the circuit substrate via a droplet of conducting liquid, such as a liquid metal, that wets between the additional moveable contacts and the pad 126. The surface between the contacts 118 and 120 and the contacts 114 and 116 is non-wettable, to prevent migration of the conducting liquid and allow the correct liquid volumes to be maintained. In an alternative embodiment, an electrical signal to the switching contacts 114 and 116 is supplied through circuit traces or conductive coatings on the actuator 112. Fixed contact pads 122 and 124 are attached to the circuit substrate. The exposed faces of the contacts are wettable by a conducting liquid, such as a liquid metal. The external surfaces separating the electrical contacts are non-wettable to prevent liquid migration. In operation, the actuator 112 is deformed in a bending mode by application of an electrical voltage across the piezoelectric element. This deformation moves the switching contacts 114 and 116 between the fixed contacts 122 and 124. For low-frequency switching, the contact pads 122, 124 and 126 may be connected to a mother substrate through suitable circuit routing together with pads and solder balls on the bottom of the circuit substrate. For medium and high frequency, the switching contact pads 122, 124 and 126 are electrically connected through circuit traces 134, 136 and 128, respectively, which may be connected with short ribbon wirebonds at the edge of the circuit substrate 102. Also, for high frequency switching, ground traces 130 may be included on the top of the circuit substrate 102, either side of the signal traces. These are discussed below with reference to FIG. 4.

Figure 3:
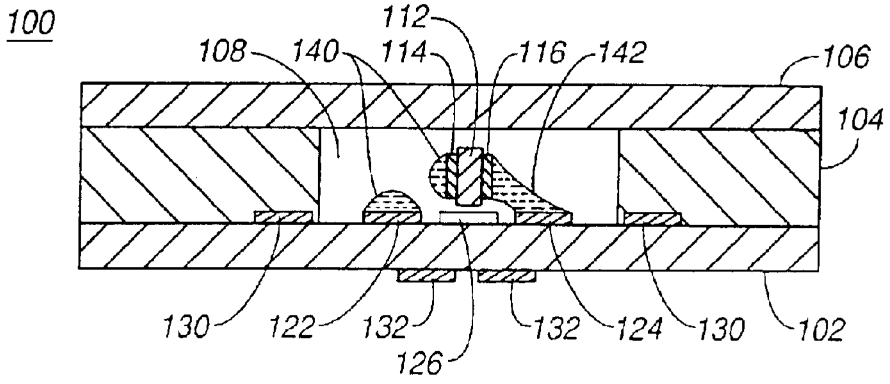
FIG. 3 is a sectional view of a latching relay of the present invention.

FIG. 3 is a sectional view through section 3—3 of the latching relay shown in FIG. 2. The view shows the three layers: the circuit substrate 102, the switching layer 104 and the cap layer 106. The free end of the piezoelectric actuator 112 is moveable within the switching channel 108 between the fixed contact pads 122 and 124. Electrical connection traces (not shown) to supply control signals to the actuator 112 may be deposited on the upper surface of the circuit substrate 102 or pass through vias in the circuit substrate. The surfaces of the contacts support droplets of conducting liquid that are held in place by the surface tension of the liquid. Due to the small size of the droplets, the surface tension dominates any body forces on the droplets and so the droplets are held in place even if the relay is moved. The liquid between contacts 114 and 122 is separated into two droplets 140, one on each of the contacts 114 and 122. The liquid between contacts 116 and 124 is coalesced into a single volume 142. Thus, there is an electrical connection between the contacts 116 and 124, but no connection between the contacts 114 and 122.

When the actuator 112 is deformed in a first direction, the first switching contact 114 is moved towards the first fixed contact 122, and the second switching contact 116 is moved away from the second fixed contact 124. When the gap between the contacts 116 and 124 is great enough, the conducting liquid is insufficient to bridge the gap between the contacts and the conducting liquid connection 142 is broken. When the gap between the contacts 114 and 122 is small enough, the liquid droplets 140 coalesce with each other and form an electrical connection between the contacts. The liquid volume is chosen so that when the actuator is de-energized and returns to its undeflected position, the coalesced droplets 140 remain coalesced and the separated droplets 142 remain separated. In this way the relay is latched into the new switch-state. The switch state can be returned to that shown in FIG. 3 by deforming the actuator 112 in the opposite direction to break the liquid connection between contacts 114 and 122 and cause the liquid droplets 142 to coalesce again.

The use of mercury or other liquid metal with high surface tension to form a flexible, non-contacting electrical connection results in a relay with high current capacity that avoids pitting and oxide buildup caused by local heating.

Figure 4:
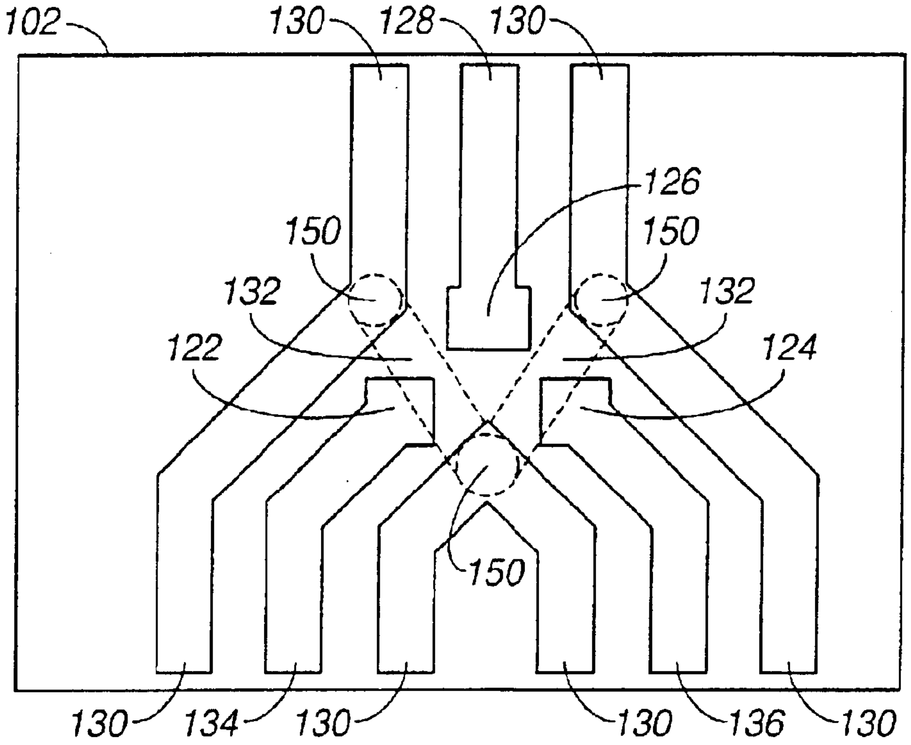
FIG. 4 is a top view of a circuit substrate of a latching relay of the present invention with the cap layer removed.

A top view of the circuit substrate 102 is shown in FIG. 4. Signal traces 128, 134 and 136 connect to fixed contact pads 126, 122 and 124 respectively. The traces are covered with a material that the conducting liquid does not wet, so as to prevent unwanted transfer of conducting liquid. Upper ground traces 130 are positioned on either side of the signal traces to provide electrical shielding. Vias 150 provide electrical connections from the upper ground traces 130 to lower ground traces 132 so that ground currents can surround the signal currents upstream and downstream of the switching structure. All bends in the traces are less than 45° to minimize reflections. Additional circuit traces (not shown) to supply control signals to the actuator may also be formed on the circuit substrate. Alternatively, the actuator may be connected through suitable circuit routing, pads and solder balls on the bottom of the substrate.

Figure 5:
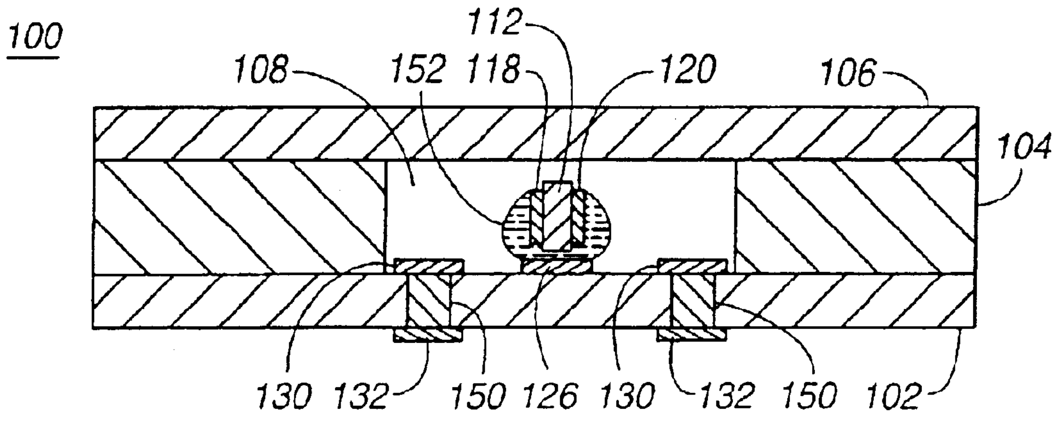
FIG. 5 is a further sectional view of a latching relay of the present invention.

FIG. 5 is a sectional view through the section 5—5 shown in FIG. 2. The conducting liquid droplet 152 fills the gap between contacts 118 and 120 and fixed contact pad 126 and completes an electrical circuit between them. The liquid volume is chosen so that motion of the piezoelectric actuator 112 will not break this liquid connection. Upper ground traces 130, on either side of the contact pad 126, are coupled through vias 150 to lower ground traces 132 so as to provide electrical shielding.

In one mode of operation, the contact pad 126 serves as a common terminal and a signal connected to the terminal is switched to either contact pad 122 or contact pad 124 by motion of the actuator 112.

While the invention has been described in conjunction with specific embodiments, it is evident that many alternatives, modifications, permutations and variations will become apparent to those of ordinary skill in the art in light of the foregoing description. Accordingly, the present invention is intended to embrace all such alternatives, modifications and variations as fall within the scope of the appended claims.

What is claimed is:

1. An electrical relay comprising:

a cap layer;

a circuit substrate;

a switching layer positioned between the circuit substrate and the cap layer and having a switching cavity formed therein;

first and second electrical traces formed on the circuit substrate and terminating at first and second fixed contact pads, respectively, in the switching cavity;

a piezoelectric actuator having a fixed end coupled to the switching layer and a free end, the piezoelectric actuator being deformable in a bending mode;

first and second switching contacts attached to the free end of the piezoelectric actuator and positioned between the first and second fixed contact pads;

a third electrical trace formed on the circuit substrate and electrically coupled to at least one of the first and second switching contacts;

a plurality of ground traces formed on the circuit substrate to provide electrical shielding to the first, second and third electrical traces;

a first conducting liquid volume in wetted contact with the first switching contact and the first fixed contact pad; and a second conducting liquid volume in wetted contact with the second switching contact and the second fixed contact pad;

wherein:

motion of the switching contacts in a first direction causes the first conducting liquid volume to form a connection between the first switching contact and the first fixed contact pad and causes the second conducting liquid volume to separate into two droplets, thereby breaking a connection between the second switching contact and the second fixed contact pad; and motion of the switching contacts in a second direction causes the first conducting liquid volume to separate into two droplets, thereby breaking the connection between the first switching contact and the first fixed contact pad and causes the second conducting liquid volume to form a connection between the second switching contact and the second fixed contact pad.

2. An electrical relay in accordance with claim 1, wherein the first and second conducting liquid volumes are liquid metal droplets.

3. An electrical relay in accordance with claim 1, wherein the first and second conducting liquid volumes are such that connected volumes remain connected when the actuator is returned to its rest position, and separated droplets remain separated when the piezoelectric actuator is not deformed.

4. An electrical relay in accordance with claim 1, further comprising:

a first moveable contact supported by the piezoelectric actuator and electrically coupled to the first and second switching contacts;

a third fixed contact pad positioned in proximity to the first moveable contact and electrically coupled to the third electrical trace; and a third conducting liquid volume in wetted contact with and forming an electrical connection between the first moveable contact and the third fixed contact pad, wherein the third conducting liquid volume is sized so that the electrical connection between the first moveable contact and the third fixed contact pad is maintained when the piezoelectric actuator is deformed.

5. An electrical relay in accordance with claim 1, wherein at least one of the first, second and third electrical traces terminates at an edge of the switching layer.

6. An electrical relay in accordance with claim 1, further comprising a second plurality of ground traces deposited on the lower surface of the circuit substrate, the first plurality of ground traces being electrically connected to the second plurality of ground traces by one or more vias passing through the circuit substrate.

7. An electrical relay in accordance with claim 1, wherein the relay is manufactured by a method of micro-machining.

8. An electrical relay in accordance with claim 1, wherein the fixed end of the piezoelectric actuator is rigidly fixed to the switching layer.

9. An electrical relay in accordance with claim 1, wherein the fixed end of the piezoelectric actuator is hinged to the switching layer.

10. An electrical relay in accordance with claim 1, wherein the first and second switching contacts are separated by surface that is non-wettable by conducting liquid.

11. An electrical relay in accordance with claim 1, wherein all of the ground traces of the plurality of ground traces are electrically coupled to each other.

12. An electrical relay in accordance with claim 1, wherein the first and second switching contacts are electrically coupled to each other.

13. An electrical relay in accordance with claim 1, wherein the third electrical trace is electrically coupled to the first switching contact and further comprising a fourth electrical trace formed on the circuit substrate and electrically coupled to the second switching contact.

* * * * *